United States Patent
Choi et al.

(10) Patent No.: US 8,361,878 B2
(45) Date of Patent: Jan. 29, 2013

(54) METHOD FOR PREPARING CERIUM OXIDE, CERIUM OXIDE PREPARED THEREFROM AND CMP SLURRY COMPRISING THE SAME

(75) Inventors: Sang-Soon Choi, Samcheok-si (KR); Myoung-hwan Oh, Daejeon (KR); Seung-Beom Cho, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/933,659

(22) PCT Filed: Mar. 18, 2009

(86) PCT No.: PCT/KR2009/001384
§ 371 (c)(1),
(2), (4) Date: Jan. 17, 2011

(87) PCT Pub. No.: WO2009/116807
PCT Pub. Date: Sep. 24, 2009

(65) Prior Publication Data
US 2011/0117720 A1    May 19, 2011

(30) Foreign Application Priority Data

Mar. 20, 2008   (KR) .................. 10-2008-0026011
Mar. 3, 2009    (KR) .................. 10-2009-0017964

(51) Int. Cl.
*H01L 21/304* (2006.01)
(52) U.S. Cl. .................. 438/424; 257/E21.237
(58) Field of Classification Search .............. 252/79.1; 257/E21.237; 438/424; 502/304
See application file for complete search history.

(56) References Cited

U.S. PATENT DOCUMENTS

| | | |
|---|---|---|
| 5,895,509 A | 4/1999 | Ohmi et al. |
| 2006/0193764 A1 | 8/2006 | Katusic et al. |
| 2007/0007246 A1* | 1/2007 | Idani .............................. 216/88 |
| 2009/0113809 A1* | 5/2009 | Sakai et al. .................... 51/309 |

FOREIGN PATENT DOCUMENTS

| | | |
|---|---|---|
| DE | 10251029 A1 | 5/2004 |
| JP | 2006-140361 A | 6/2006 |
| KR | 10-2008-0011044 A | 1/2008 |
| WO | 2001/036332 A1 | 5/2001 |
| WO | 2007/043817 A1 | 4/2007 |
| WO | 2008/023858 A1 | 2/2008 |
| WO | WO2008023858 A1 * | 2/2008 |

OTHER PUBLICATIONS

Chen, Huey-Ing and Chang, Hung-Yi. Homogeneous precipitation of cerium dioxide nanoparticles in alcohol/water mixed solvents. Jun. 15, 2004. Elsevier. Colloids and Surfaces A: Physiochem. Eng. Aspects 242 p. 61-69.*

H. Chen et al.: "Homogeneous precipitation of cerium dioxide nanoparticles in alcohol/water mixed solvents," Colloids and Surfaces A: Physicochem, Eng. Aspects, vol. 242, 2004, pp. 61-69.

* cited by examiner

*Primary Examiner* — Julio J Maldonado
*Assistant Examiner* — Daniel Shook
(74) *Attorney, Agent, or Firm* — Rothwell, Figg, Ernst & Manbeck, P.C.

(57) ABSTRACT

The present invention relates to a method for preparing cerium oxide which enables preparation of cerium oxide showing improved polishing performance, cerium oxide prepared therefrom, and CMP slurry comprising the same.

The method for preparing cerium oxide comprises the step of contacting cerium oxide with primary alcohol to increase specific surface area of the cerium oxide 10% or more.

16 Claims, 1 Drawing Sheet

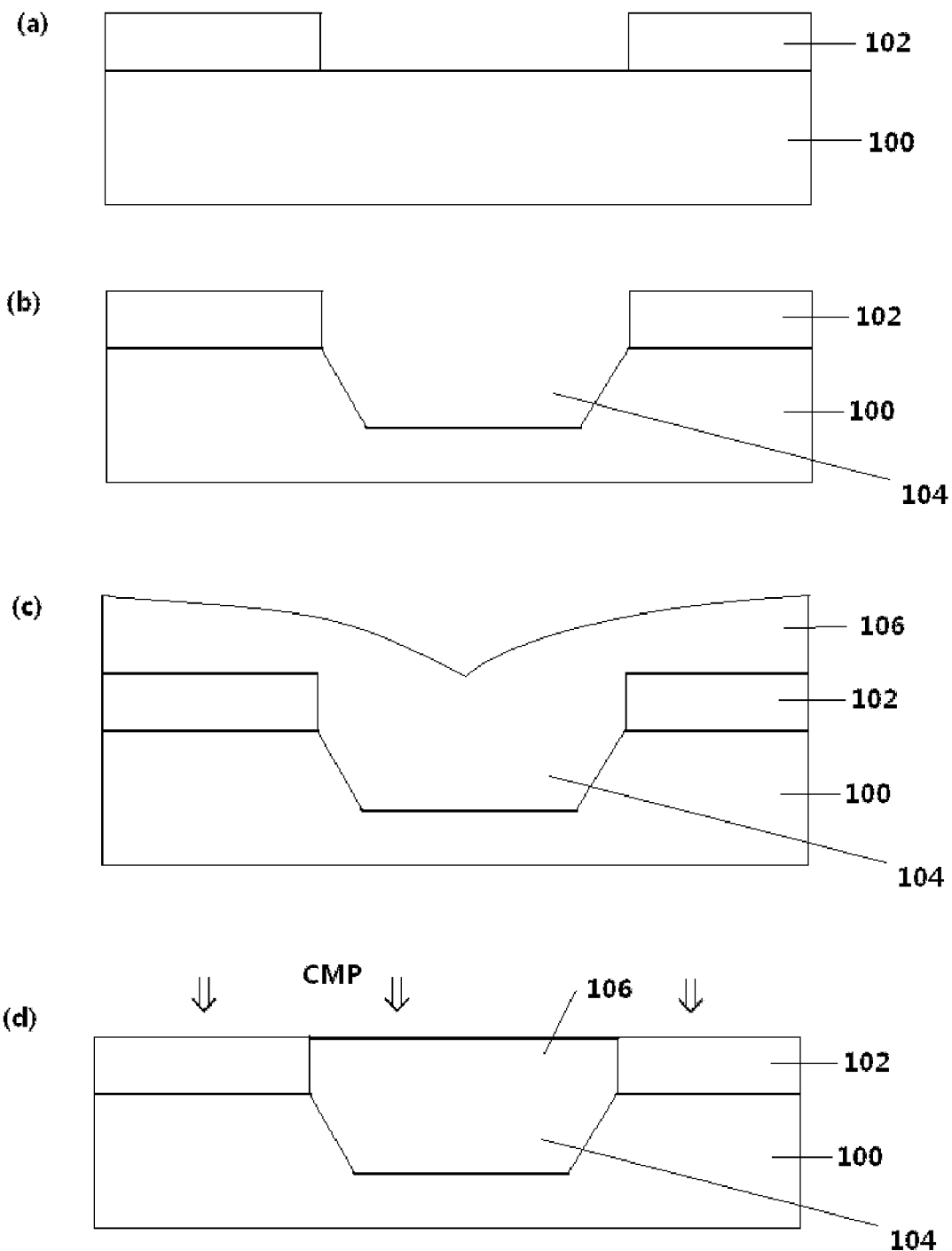

METHOD FOR PREPARING CERIUM OXIDE, CERIUM OXIDE PREPARED THEREFROM AND CMP SLURRY COMPRISING THE SAME

CROSS REFERENCE TO RELATED APPLICATIONS

This application is a 35 U.S.C. §371 National Phase Entry Application from PCT/KR2009/001384, filed Mar. 18, 2009, and designating the United States, which claims priority under 35 U.S.C. §119 to Korean Patent Application No. 10-2008-0026011 filed Mar. 20, 2008 and Korean Patent Application No. 10-2009-0017964 filed Mar. 3, 2009, which are incorporated herein in their entirety.

BACKGROUND OF THE INVENTION (a) Field of the Invention

The present invention relates to a method for preparing cerium oxide, cerium oxide prepared therefrom and CMP slurry comprising the same. More specifically, the present invention relates to a method for preparing cerium oxide which enables preparation of cerium oxide showing improved polishing performance, cerium oxide prepared therefrom, and CMP slurry comprising the same.

(b) Description of the Related Art

In recent years, a semiconductor manufacture process shows a tendency to increase a diameter of wafer, and severe manufacture environments such as decrease in minimum line width required for device manufacture to 0.13 μm or less, is required for ULSI (Ultra Large Scale Integration). And, for improvement in device performance, a process of forming multiple interconnection or multilayer interconnection on a wafer is essentially required. However, non-planarization of a wafer generated after the above process may decrease subsequent process margin or deteriorate device property. In order to overcome these problems, planarization techniques are used for various manufacture processes.

As the planarization technique, CMP (chemical mechanical polishing) is predominantly used, which presses the surface of a polishing pad that rotates relatively to a wafer surface with providing CMP slurry to the polishing pad, thereby planarizing the wafer surface by chemical and mechanical operations.

The CMP technique can be used in the step of polishing a silicon oxide layer until a polishing stop layer, e.g., a silicon nitride layer is exposed, after the silicon oxide layer is deposited so as to embed a trench on a wafer, during the process of forming a device isolation layer by STI (shallow trench isolation).

Wherein, it is more preferable that removal selectivity for a silicon oxide layer compared to a silicon nitride layer (a silicon oxide layer polishing rate compared to a silicon nitride layer polishing rate) is higher. If the removal selectivity for the silicon oxide layer compared to the silicon nitride layer is low, it is difficult to uniformly remove a pattern of a polishing stop layer such as the silicon nitride layer, and thickness change of the polishing stop layer may be large over the whole wafer. Thus, a level difference between an active area and a field area may be caused in the final structure having a trench to decrease subsequent process margin, thus decreasing economical efficiency.

CMP slurry generally comprises an abrasive, a dispersant and water. And, physicochemical property of the abrasive influences on polishing performance such as a silicon nitride layer polishing rate, a silicon oxide layer polishing rate, removal selectivity for a silicon oxide layer compared to a silicon nitride layer, etc.

Particularly, strength or size of an abrasive is closely related to polishing rate of the surface to be polished. The abrasive can polish the surface to be polished by a mechanical polishing device. And, the higher strength and the larger size of the abrasive increase the silicon nitride layer or silicon oxide layer polishing rate.

Meanwhile, in case cerium oxide is used as an abrasive, cerium oxide is known to be capable of chemical polishing in addition to mechanical polishing. Cerium oxide can form a chemical bond of Si—O—Ce due to its high reactivity with a silicon oxide layer, thereby removing silicon oxide mass on the surface of a silicon oxide layer to polish the silicon oxide layer. Removal selectivity for the silicon oxide layer compared to the silicon nitride layer, especially a silicon oxide layer polishing rate can be varied according to chemical activity of cerium oxide.

Accordingly, it is required to appropriately control physicochemical properties of cerium oxide used as an abrasive in order to increase circuit reliability and improve economical efficiency of manufacture.

SUMMARY OF THE INVENTION

The present invention provides a method for preparing cerium oxide which enables preparation of cerium oxide showing appropriate physicochemical properties and more improved polishing performance.

Also, the present invention provides cerium oxide prepared by the above method.

Further, the present invention provides CMP slurry which comprises an abrasive comprising the above cerium oxide.

Further, the present invention provides a polishing method and a method for forming a device isolation layer of semiconductor device using the above CMP slurry.

Specifically, the present invention provides a method for preparing cerium oxide comprising the step of contacting cerium oxide with primary alcohol to increase specific surface area of the cerium oxide 10% or more.

The present invention also provides cerium oxide prepared by the above method, having specific surface area of 8 $m^2/g$~100 $m^2/g$.

The present invention also provides CMP slurry which comprises an abrasive comprising the above cerium oxide.

The present invention also provides a polishing method comprising the step of polishing a target layer on a semiconductor substrate with the above CMP slurry.

The present invention also provides a method for forming a device isolation layer of semiconductor device, comprising the steps of: forming a given silicon nitride layer pattern on a semiconductor substrate; etching the semiconductor substrate using the silicon nitride layer pattern as a mask to form a trench; forming a silicon oxide layer so as to embed the trench; and, polishing the silicon oxide layer using the above CMP slurry until the silicon nitride layer pattern is exposed.

BRIEF DESCRIPTION OF THE DRAWING

FIG. 1 illustrates the steps of forming a device isolation layer of a semiconductor device. FIG. 1(a) illustrates forming a silicon nitride layer pattern (102) on a semiconductor substrate (100). FIG. 1(b) illustrates etching the semiconductor substrate (100) using the silicon nitride layer pattern (102) as a mask to form a trench (104). FIG. 1(c) illustrates forming a silicon oxide layer (106) so as to embed the trench (104). FIG.

1(*d*) illustrates polishing the silicon oxide layer (106) using CMP slurry until the silicon nitride layer pattern (102) is exposed.

DETAILED DESCRIPTION OF THE EMBODIMENTS

A method for preparing cerium oxide, cerium oxide prepared therefrom, CMP slurry comprising the same, and a polishing method using the same according to specific embodiments of the invention will now be explained.

According to one embodiment of the invention, a method for preparing cerium oxide comprising the step of contacting cerium oxide with primary alcohol to increase specific surface area of the cerium oxide 10% or more is provided.

The method for preparing cerium oxide will be explained in detail.

In case cerium oxide is used as an abrasive of CMP slurry, CMP polishing performance is influenced by physicochemical properties of cerium oxide and the physicochemical properties of cerium oxide can be varied by specific surface area of cerium oxide.

Specifically, the inside of the cerium oxide particle has more complete crystal structure and thus is chemically stabilized, while particle surface thereof has comparatively incomplete crystal structure and thus has high chemical activity and is likely to receive other atoms or ions. Thus, Si—O—Ce chemical bonding between cerium oxide and silicon oxide layers predominantly occurs at the surface of cerium oxide. Therefore, it appears that larger the specific surface area of cerium oxide, more active the chemical polishing of cerium oxide thus increasing polishing rate of a target layer such as a silicon oxide layer.

And, if specific surface area of cerium oxide is large, it can be easily broken by external pressure because its frame is relatively weak. Thus, scratch of the polished surface caused by large particles can be decreased.

Accordingly, in order to appropriately control physicochemical properties of cerium oxide to effectively improve polishing performance including polishing rate for a silicon oxide layer, removal selectivity for a silicon oxide layer compared to a silicon nitride layer and minimization of scratch of polished surface, etc., increasing particle surface (specific surface area) of cerium oxide may be considered.

As results of experiments by present inventors, it was confirmed that specific surface area of cerium oxide changes when contacting cerium oxide with primary alcohol. Particularly, it was confirmed that specific surface area of cerium oxide can be increased 10% or more, preferably 10 to 60% by contacting cerium oxide with primary alcohol.

Therefore, according to the method for preparing cerium oxide according to one embodiment of the invention, preparation of cerium oxide having increased specific surface area is enabled by simplified process, thereby further improving polishing performance of cerium oxide as a CMP abrasive. For example, the cerium oxide having increased specific surface area, when used as an abrasive for CMP slurry which polishes a target layer such as a silicon oxide layer, can improve polishing rate for the target layer and increase removal selectivity for the target layer compared to a polishing stop layer (e.g., silicon nitride layer), thus showing more improved polishing performance as a CMP abrasive.

In the method for preparing cerium oxide, increasing rate of the specific surface area of cerium oxide can be varied by contact weight ratio of the cerium oxide and the primary alcohol or reaction conditions such as contact temperature, etc., and it may be varied within the ranges of 10% or more, preferably from 10 to 60%.

For example, the higher contact ratio (weight ratio) of the primary alcohol to the cerium oxide increases specific surface area of cerium oxide; however, the contact weight ratio of the cerium oxide and the primary alcohol is preferably 1:0.1 to 1:4. If the contact weight ratio of the primary alcohol is less than the above range, specific surface area increasing effects are not significant, and if it exceeds the above range, specific surface area increasing rate is low compared to the amount of the primary alcohol, thus decreasing economical efficiency.

And, the higher contact temperature increases specific surface area of cerium oxide; however, the contact temperature is preferably 10 to 70° C. If the contact temperature is less than 10° C., specific surface area increasing effects are not significant, and if it exceeds 70° C., primary alcohol may be vaporized too much and cerium oxide may be burned blackly.

And, the longer contact time of the cerium oxide with the primary alcohol increases specific surface area of cerium oxide; however, the contact time is preferably 5 minutes to 6 hours. If the contact time is less than 5 minutes, specific surface area increasing effects are not significant, and if it exceeds 6 hours, specific surface area increasing rate is low compared to the contact time, thus decreasing economical efficiency.

And, the contact between the cerium oxide and the primary alcohol is preferably conducted with agitation. Wherein, higher the agitation speed, larger the specific surface area of cerium oxide; however, the agitation speed is preferably 10 rpm to 500 rpm. If the agitation speed is less than 10 rpm, specific surface area increasing effects by agitation are not significant, and if it exceeds 500 rpm, energy loss during the process or equipment cost may decrease economical efficiency.

Meanwhile, as the primary alcohol used for preparing cerium oxide, any alcohol having one alkyl group substituted for carbinol carbon can be used without limitations, and those having volatility are preferable. For example, the primary alcohol may be alcohol having carbon number of from 1 to 6, for examples, methanol, ethanol, propanol or butanol, etc.

And, preferably, the method for preparing the cerium oxide further comprises the step of separating, washing or drying, after contacting the cerium oxide with primary alcohol.

The separation can be conducted by common separation method known in the art, such as separation by cooling or centrifugal separation. And, the washing is preferably conducted using DI water such that ion value may be 3 mS or less.

The drying is preferably conducted under oxygen atmosphere in order to compensate oxygen ($O_2$) gas decomposed by primary alcohol. Wherein, in order to form sufficient oxidation condition, atmosphere comprising 10% by volume or more of oxygen is preferably used.

According to one embodiment of the invention as described above, cerium oxide having more increased specific surface area thus showing more improved polishing performance can be prepared.

According to another embodiment of the invention, cerium oxide prepared by the above method and having specific surface area of 8 $m^2/g$~100 $m^2/g$ is provided. Specifically, the cerium oxide prepared by the above method can have large specific surface area reaching maximum 100 $m^2/g$ thus showing improved polishing performance. The specific surface area may be as measured by BET method.

If the specific surface area of cerium oxide is less than 8 $m^2/g$, strength of cerium oxide is large thus generating a lot of scratch on the polished surface, and if it exceeds 100 m²/g, polishing rate may be decreased.

And, the cerium oxide preferably has crystallite size of 10 to 60 nm. If the crystallite size is less than 10 nm, polishing rate tends to be low, and if it exceeds 60 nm, serious scratch may be caused on the polished surface. Wherein, the crystallite size is calculated by Scherrer Equation after measuring Full Width Half Maximum of main peak of cerium oxide using X-ray diffraction spectrometer.

As the cerium oxide has larger specific surface area, when used as an abrasive for CMP slurry which polishes the target layer such as a silicon oxide layer, it can largely improve polishing rate for the target layer and increase removal selectivity for the target layer compared to polishing stop layer (e.g., a silicon nitride layer), thus showing more improved polishing performance.

According to another embodiment of the present invention, CMP slurry which comprises an abrasive comprising the above cerium oxide is provided. The CMP slurry may further comprise a dispersant and water in addition to the abrasive.

The content of the abrasive in the slurry is preferably 1 to 10 parts by weight based on 100 parts by weight of the slurry. If the content of the cerium oxide in the slurry is less than 1 part by weight, a surface to be polished is difficult to be polished, and if it exceeds 10 parts by weight, a viscosity of the slurry increase thus decreasing dispersion stability.

And, the dispersant is preferably contained in an amount of 0.0001 to 10 parts by weight, preferably 0.2 to 3 parts by weight, based on 100 parts by weight of the abrasive. If the content of the dispersant is less than 0.0001 parts by weight, dispersion ability is low thus accelerating precipitation, and thus precipitation may occur when transferring the slurry, which may cause non-uniform provision of the abrasive. If the content of the dispersant exceeds 10 parts by weight, a dispersant layer functioning as a cushion forms thickly around abrasive particles, and thus the surface of an abrasive is difficult to be contacted to the surface to be polished thus decreasing polishing rate.

As the dispersant, non-ionic polymer dispersant or anionic polymer dispersant can be used. The non-ionic polymer dispersant may be selected from the group consisting of polyvinyl alcohol (PAA), ethylene glycol (EG), glycerin, polyethylene glycol (PEG), polypropylene glycol (PPG), polyvinyl pyrrolidone (PVP) and a mixture thereof, and the anionic polymer dispersant may be selected from the group consisting of polyacrylic acid, polyacrylic acid ammonium salt, polyacryl maleic acid and a mixture thereof. However, the dispersant is not limited thereto, and various dispersants known to be useable for CMP slurry can be used without limitations.

And, the CMP slurry may further comprise other additives for improving polishing performance or dispersion stability of the slurry. The content of water in the CMP slurry may be the balance, after determining the contents of the abrasive, dispersant and other additives.

Preferably, the CMP slurry is titrated to pH 6 to 8, after mixing the cerium oxide powder, dispersant and water. The titration may be conducted using 1N KOH or 1N $HNO_2$.

After pH titration, in order to improve dispersion and storage stability, dispersion stabilization process is preferably conducted. The dispersion stabilization process may be conducted using common dispersion apparatus in the art. For example, APEX mill (Kotobuki eng. & mfg. Co. Japan) can be used. Wherein it is preferable that zirconia bead with a size of 0.01 to 1 mm is used, and a mixed solution of cerium oxide powder, dispersant and water is transferred at a rate of 10 to 1000 mL/min while repeatedly rotating 1 to 20 passes at a speed of 2000 to 5000 rpm The CMP slurry has an excellent polishing rate for the target layer such as a silicon oxide layer, and increases removal selectivity for the target layer compared to other layers, thus preferably used for CMP polishing or planarization of a silicon oxide layer, etc.

According to another embodiment of the invention, a polishing method comprising the step of polishing a target layer on a semiconductor substrate with the above CMP slurry is provided, wherein the target layer is preferably a silicon oxide layer.

Accordingly, the polishing method can be preferably applied for ILD (Inter Layer Dielectric) forming process of the semiconductor device, a device isolation layer forming process using STI (Shallow Trench Isolation), etc.

The method for forming a device isolation layer using the above CMP slurry may comprise the steps of: forming a given silicon nitride layer pattern on a semiconductor substrate; etching the semiconductor substrate using the silicon nitride layer pattern as a mask to form a trench; forming a silicon oxide layer so as to embed the trench; and, polishing the silicon oxide layer using the above CMP slurry until the silicon nitride layer pattern is exposed.

According to more specific example, the method for forming a device isolation layer may comprise the steps of: (a) sequentially depositing pad silicon oxide layer and silicon nitride layer on a semiconductor substrate, and patterning the pad silicon oxide layer and silicon nitride layer using photoresist pattern; (b) etching the semiconductor substrate according to the silicon nitride layer pattern to from a trench with a given depth; (c) depositing a silicon oxide layer so as to embed the trench; (d) polishing the silicon oxide layer until the silicon nitride layer pattern is exposed (CMP step); and, (e) removing the pad silicon oxide layer and silicon nitride layer pattern by etching, and forming a gate silicon oxide layer on the semiconductor substrate.

In the method for forming a device isolation layer, by using a cerium oxide abrasive and CMP slurry showing larger specific surface area and excellent polishing properties (for examples, excellent polishing rate for a silicon oxide layer and excellent removal selectivity for the silicon oxide layer compared to a silicon nitride layer), a desired device isolation layer can be formed with largely decreasing level difference between a field area and an active area.

EXAMPLES

The invention is further explained in more detail with reference to the following examples. These examples, however, should not be interpreted as limiting the scope of the invention in any manner.

Preparation of Cerium Oxide

Example 1

100 g of cerium oxide having specific surface area of 26 m²/g and 300 g of ethanol were mixed, and then, the reaction mixture was agitated at 30° C. for 20 minutes at a speed of 100 rpm. The obtained product was centrifuged and washed, and then, dried under oxygen atmosphere at 50° C. for 6 hours.

For the prepared cerium oxide, specific surface area was measured by BET method using Micrometrics Co. (USA), 2010 equipment. As the result, the specific surface area of cerium oxide was 32 m²/g, confirming increase in specific surface area cerium oxide.

Examples 2-4

Cerium oxides were prepared by the same method as Example 1, except that contact temperature, contact time or agitation speed was changed as shown in the following Table 1.

For the prepared cerium oxides, specific surface area was measured by BET method using Micrometrics Co. (USA), 2010 equipment. As the result, the specific surface area of cerium oxides increased from 26 m²/g to 38 m²/g, 36 m²/g and 34 m²/g respectively, confirming increase in specific surface area of cerium oxide.

TABLE 1

| | Contact weight ratio of cerium oxide:ethanol (g:g) | Contact temperature | Contact time | Contact agitation speed | Specific surface area |
|---|---|---|---|---|---|
| example 1 | 100:300 | 30° C. | 20 minutes | 100 RPM | 32 m²/g |
| example 2 | 100:300 | 60° C. | 20 minutes | 100 RPM | 38 m²/g |
| example 3 | 100:300 | 30° C. | 2 hours | 100 RPM | 36 m²/g |
| example 4 | 100:300 | 30° C. | 20 minutes | 300 RPM | 34 m²/g |

Preparation of CMP Slurry

Example 5

100 g of cerium oxide respectively prepared in the Examples 1-4, 2 g of polyacrylic acid dispersant (Aldrich, Mw 4,000), and 900 g of ultrapure water were mixed, and then, ultrapure water was added to the mixed solution such that the content of the cerium oxide may be 2 parts by weight per 100 parts by weight of total slurry, to prepare a cerium oxide dispersion.

The prepared cerium oxide dispersion was titrated to pH 7.0 using ammonia water, and then, dispersion stability improving and particle size control process was conducted with AFEX mill. Wherein, 100 g of zirconia bead with a size of 0.1 mm was used, and the process was conducted under 3 pass condition at a speed of 3750 rpm with transferring the cerium oxide dispersion at a rate of 400 mL/min, to prepare CMP slurry. The average particle size of the cerium oxide was measure by particle size distribution analyzer (Horiba LA-910), and the result was shown in the following Table 2.

Comparative Example 1

CMP slurry was prepared by the same method as Example 5, except that cerium oxide having specific surface area of 26 m²/g was used instead of the cerium oxides of Examples 1~4.

Experiment

Evaluation of Polishing Performance

The CMP slurry respectively prepared in Example 5 and Comparative Example 1 were used for polishing under the following conditions for 1 minute and then, washed and thickness change generated by the polishing was measured to evaluate the polishing performance. The results were shown in the following Table 2.
[Polishing Conditions]
Polishing equipment: POLY 400 (GNP Technology Co.)
Pad: polyurethane type
Platen speed: 90 rpm
Carrier speed: 90 rpm
Pressure: 280 g/cm²
Slurry flow rate: 100 ml/min
[Polishing Target]
A silicon oxide layer forming wafer deposited with a thickness of 7000 Å by PECVD (plasma enhanced chemical vapor deposition) (5 in²)
A silicon nitride layer forming wafer deposited with a thickness of 1500 Å by LPCVD (Low pressure chemical vapor deposition) (5 in²)
[Evaluation]
Change of thickness before and after polishing was measured with Nanospec 6100 (Nanometeics Company). From the thickness change before and after polishing, polishing rate per hour for each silicon oxide layer or silicon nitride layer was calculated, and removal selectivity was calculated from the polishing rate for the silicon oxide layer/polishing rate for the silicon nitride layer.

TABLE 2

| | Specific surface area of cerium oxide | Average particle diameter of cerium oxide | Polishing rate(Å/min) | | Removal selectivity |
|---|---|---|---|---|---|
| | | | Silicon oxide layer | Silicon nitride layer | |
| Example 1 | 32 m²/g | 189 nm | 4261 | 68 | 67 |
| Example 2 | 38 m²/g | 182 nm | 3898 | 47 | 83 |
| Example 3 | 36 m²/g | 190 nm | 4122 | 64 | 64 |
| Example 4 | 34 m²/g | 186 nm | 4227 | 66 | 64 |
| Comparative Example 1 | 26 m²/g | 191 nm | 3748 | 67 | 56 |

From the Table 2, it was confirmed that in case cerium oxide prepared so as to have larger specific surface area according to Examples 1 to 4 was used as an abrasive, CMP slurry comprising the same shows improved polishing rate for a silicon oxide layer and excellent removal selectivity for a silicon oxide layer compared to a silicon nitride layer.

What is claimed is:

1. A method for preparing cerium oxide having increased specific surface area comprising the step of contacting starting cerium oxide with primary alcohol in a contact weight ratio of 1:0.1~1:4 cerium oxide to primary alcohol, wherein said cerium oxide prepared has specific surface area that is increased 10% or more compared to said starting cerium oxide.

2. The method according to claim 1, wherein the specific surface area of the cerium oxide is increased 10 to 60%.

3. The method according to claim 1, wherein the contact between the cerium oxide and the primary alcohol is conducted at temperature range of 10° C.~70° C.

4. The method according to claim 1, wherein the contact between the cerium oxide and the primary alcohol is conducted for 5 minutes to 6 hours.

5. The method according to claim 1, wherein the contact between the cerium oxide and the primary alcohol is conducted at an agitation speed of 10 rpm~500 rpm.

6. The method according to claim 1, wherein the primary alcohol has carbon number of from 1 to 6.

7. The method according to claim 1, further comprising the step of drying a mixture of the cerium oxide and the primary alcohol, after contacting the cerium oxide and the primary alcohol.

8. The method according to claim 7, wherein the drying is conducted under atmosphere comprising 10% by volume or more of oxygen.

9. Cerium oxide prepared by the method according to claim 1, having specific surface area of 8 m$^2$/g~100 m$^2$/g, and wherein the cerium oxide has crystallite size of 10~60 nm.

10. CMP slurry which comprises an abrasive comprising the cerium oxide of claim 9.

11. The CMP slurry according to claim 10, further comprising water and a dispersant.

12. The CMP slurry according to claim 11, wherein the slurry comprises 1~10 parts by weight of the abrasive based on 100 parts by weight of the slurry, and 0.001 to 10 parts by weight of the dispersant based on 100 parts by weight of the abrasive.

13. The CMP slurry according to claim 11, wherein the dispersant is selected from the group consisting of polyvinyl alcohol, ethylene glycol, glycerin, polyethylene glycol, polypropylene glycol, polyvinyl pyrrolidone, polyacrylic acid, polyacrylic acid ammonium salt, polyacryl maleic acid, and a mixture thereof.

14. A polishing method comprising the step of polishing a target layer on a semiconductor substrate using the CMP slurry of claim 10.

15. The method according to claim 14, wherein the target layer comprises a silicon oxide layer.

16. A method for forming a device isolation layer of semiconductor device, comprising the steps of:
   forming a given silicon nitride layer pattern on a semiconductor substrate;
   etching the semiconductor substrate using the silicon nitride layer pattern as a mask to form a trench;
   forming a silicon oxide layer so as to embed the trench; and
   polishing the silicon oxide layer using the CMP slurry of claim 10 to expose the silicon nitride layer pattern.

* * * * *